United States Patent
Hazra et al.

(10) Patent No.: US 11,909,853 B2
(45) Date of Patent: Feb. 20, 2024

(54) METHODS AND SYSTEMS FOR CALIBRATING CLOCK SKEW IN A RECEIVER

(71) Applicant: SAMSUNG ELECTRONICS CO., LTD., Suwon-si (KR)

(72) Inventors: Saikat Hazra, Bengaluru (IN); Avneesh Singh Verma, Bengaluru (IN); Raghavendra Molthati, Bengaluru (IN); Sunil Rajan, Bengaluru (IN); Tamal Das, Bengaluru (IN); Ankit Garg, Bengaluru (IN); Praveen S Bharadwaj, Bengaluru (IN); Sanjeeb Kumar Ghosh, Bengaluru (IN)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 17/696,406

(22) Filed: Mar. 16, 2022

(65) Prior Publication Data

US 2023/0198732 A1   Jun. 22, 2023

(30) Foreign Application Priority Data

Dec. 17, 2021   (IN) .............................. 202141058947

(51) Int. Cl.
*H04L 7/00* (2006.01)
*G06F 1/10* (2006.01)

(52) U.S. Cl.
CPC .............. *H04L 7/0016* (2013.01); *G06F 1/10* (2013.01)

(58) Field of Classification Search
CPC ...... G06F 1/10; G06F 1/04; G06F 1/08; H04L 7/0016; H04L 7/0079; H04L 7/02; H04L 7/033; H03K 5/135; H03K 5/15; H03K 5/15013
See application file for complete search history.

(56) References Cited

U.S. PATENT DOCUMENTS

| | | | |
|---|---|---|---|
| 5,381,416 A | 1/1995 | Vartti et al. | |
| 7,840,831 B2* | 11/2010 | Jang ....................... | H03K 5/135 327/354 |
| 7,844,021 B2 | 11/2010 | Gibbons et al. | |
| 9,209,962 B1 | 12/2015 | Mishra et al. | |
| 9,304,532 B2* | 4/2016 | Jung ......................... | G06F 1/10 |
| 9,548,855 B2 | 1/2017 | Chattopadhyay et al. | |
| 2016/0373242 A1 | 12/2016 | Mishra et al. | |

* cited by examiner

*Primary Examiner* — Betsy Deppe
(74) *Attorney, Agent, or Firm* — Sughrue Mion, PLLC

(57) ABSTRACT

Methods and systems for calibrating clock skew in a SerDes receiver. A method includes detecting a skew in a clock with respect to an edge of a reference clock, based on a value sampled by the clock and a value sampled by the reference clock at an edge of a data pattern, for a first Phase Interpolator (PI) code; determining a count of the skew from a de-serialized data word including outcome values obtained based on values sampled by the clock and values sampled by the reference clock at a predefined number of edges of the data pattern; obtaining a skew calibration code corresponding to the first PI code, from a binary variable obtained by accumulating an encoded variable to a previously generated binary variable; and calibrating the skew by performing a positive phase shift or a negative phase shift to the clock based on the skew calibration code.

20 Claims, 11 Drawing Sheets

METHODS AND SYSTEMS FOR CALIBRATING CLOCK SKEW IN A RECEIVER

CROSS-REFERENCE TO RELATED APPLICATION

This application claims priority from Indian Patent Application No. 202141058947 filed on Dec. 17, 2021, at the Indian Patent Office, the disclosure of which is incorporated by reference herein in its entirety.

BACKGROUND

1. Field

The disclosure relates to Serializer-Deserializer (SerDes) receivers, and more particularly, to methods and systems for improving the performance of SerDes receivers by detecting clock skews and calibrating the detected clock skews.

2. Description of Related Art

The performance of a receiver (such as a high-speed Serializer-Deserializer (SerDes) receiver) depends on the ability of the receiver to sample incoming data sequences at appropriate positions (such as edges or pulses in a data sequence). When data rate of an incoming data sequence is high, the receiver can utilize a plurality of clock sequences to recover the incoming data sequence, wherein the clock rates of the plurality of clock sequences is lower than the data rate (such as quarter-rate or half-rate clocks). However, due to the utilization of the plurality of clocks, there is a chance that clock skew may occur among one or more of the plurality of clocks. This, in turn, can affect the performance of the receiver, particularly in terms of jitter tolerance and noise tolerance. The presence of clock skew can reduce the eye margin.

The receivers can include a Clock and Data Recovery (CDR) circuit, which can manage the variation of frequency of the plurality of clocks and phase of each of the plurality of clocks with respect to the phases of the other clocks. The variation of the phase and the frequency is based on sampled values of the incoming data sequence. The presence of clock skew introduces a deviation of phase differences, amongst each of the plurality of clocks, from the ideal phase differences. This deviation in the phase differences may be present in fabricated chips due to random mismatches inherent in fabrication technology. As the data rates continue to increase, the number of clocks (clock phases) utilized by the receiver increases. The possibility of skew increases with the increase in the number of clock phases utilized by the receiver, thereby degrading the performance of the receiver.

FIG. 1 depicts an example of a full-rate sampling clock used for recovering a data pattern. The data pattern is referred to as DATA and the complement of DATA is referred to as DATA BAR (DATA B). The data pattern and its complement form a differential pair. As depicted in FIG. 1, data rate of the data pattern and clock rate of the clock used for sampling the data pattern are same. Therefore, the clock is termed as a full-rate sampling clock. The bit period of the data pattern and the time period of the clock are same (e.g., Unit Interval (UI)). The positive edges of the clock sample correspond to the centre of the data pulses of the data pattern, and the negative edges of the clock sample correspond to the edges of the data pulses of the data pattern.

FIG. 2 depicts an example of half-rate sampling clocks used for recovering a data pattern. As depicted in FIG. 2, clock rate of the clocks used for sampling the data pattern are half of the data rate of the data pattern. Therefore, the clocks can be termed as half-rate sampling clocks. The time period of the clocks is double (2*UI) compared to the bit period of the data pattern (UI). If a single clock is used, the receiver would use the rising edges and the falling edges of the clock to sample the centre of the data pulses of the data pattern as described above with reference to FIG. 1. However, when two half-rate clocks are being utilized (as depicted), the phase difference between the clocks is 180 degrees, and the positive edges of the clocks can be used for sampling the data pattern. The two clocks alternatively sample the centre of the pulses of the data pattern using the positive edges.

FIG. 3 depicts an example quarter-rate sampling clocks used for recovering a data pattern. As depicted in FIG. 3, clock rate of the clocks used for sampling the data pattern are a quarter of the data rate of the data pattern. Therefore, the clocks can be termed as quarter-rate sampling clocks. The time period of the clocks is four times (4*UI) than that of the bit period of the data pattern (UI). If two clocks are used, the receiver would use the rising edges and the falling edges of the clocks to sample the centre of the data pulses of the data pattern as described above with reference to FIG. 2. However, when four quarter-rate clocks are being utilized (as depicted), the positive edges of the clocks can be used for sampling the data pattern. The four clocks take turns to sample the centre of the pulses of the data pattern using their respective positive edges. The phase differences between the clocks are 90 degrees (CLK 90), 180 degrees (CLK 180), and 270 degrees (CLK 270) with respect to a reference clock (CLK 0).

The sampling error margin available to the clocks is half of the time period of the data pattern (e.g., UI/2).

FIG. 4 depicts an example reduction of sampling error margin due to skew in one of the quarter-rate sampling clocks. As depicted in FIG. 4, when the clock CLK 90 is skewed with respect to the other clocks and the skew is positive, a positive edge of the clock CLK 90 appears earlier than the ideal instant indicated as "Ideal rising edge". Due to the skew, the sampling error margin available to the clock CLK 90 is reduced. Thus, the receiver is vulnerable to factors such as jitter, noise, inter-symbol interference, and so on.

SUMMARY

Provided are methods and systems for performing clock skew calibration in a receiver by detecting presence of skews in clock signals with respect to a reference clock signal aligned to a data pattern, and adjusting the phase of the clock signals based on skew calibration codes to align the clock signals with the reference clock signal.

Also provided are methods and systems for detecting the presence of skew in each of the clock signals based on values sampled by the each of the clock signals and the reference clock signal at a predefined number of the edges of the data pattern.

Also provided are methods and systems for generating words corresponding to each of the clock signals, indicating whether the skew present in each of the clock signals is a positive skew or a negative skew, based on the values sampled by the each of the clock signals and values sampled by the reference clock signal, at the predefined number of edges of the data pattern.

Also provide are methods and systems for generating skew calibration codes, corresponding to each Phase Interpolator (PI) code, for each of the clock signals, based on encoded variables, wherein the encoded variables are generated based on the words corresponding to each of the clock signals.

Also provided are methods and systems for computing an average of the skew calibration codes, corresponding to each of the PI codes, for each of the clock signals, wherein the clock signals are aligned to the reference clock signal based on the corresponding average skew calibration codes for calibrating the detected skews.

According to an embodiment, there is provided a method for performing calibration on a clock skew in a receiver. The method includes: detecting, by the receiver, a skew in a clock, with respect to an edge of a reference clock, based on a first value sampled by the clock and a second value sampled by the reference clock at an edge of a data pattern, for a first Phase Interpolator (PI) code; determining, by the receiver, a count of the skew from a de-serialized data word, wherein the de-serialized data word includes a plurality of outcome values obtained based on a plurality of first values sampled by the clock and a plurality of second values sampled by the reference clock, at a predefined number of edges of the data pattern; obtaining, by the receiver, a skew calibration code corresponding to the first PI code, from a binary variable, wherein the binary variable is obtained by accumulating an encoded variable generated based on the count of the skew in the de-serialized data word, to a previously generated binary variable; and calibrating, by the receiver, the skew in the clock by performing one of a positive phase shift or a negative phase shift to the clock based on the skew calibration code, to align edges of the clock with the edges of the data pattern and edges of the reference clock.

According to an embodiment, there is provided an apparatus for performing calibration on a clock skew, including: at least one processor configured to: detect a skew in a clock, with respect to an edge of a reference clock, based on a first value sampled by the clock and a second value sampled by the reference clock at an edge of a data pattern, for a first Phase Interpolator (PI) code; determine a count of the skew from a de-serialized data word, wherein the de-serialized data word includes a plurality of outcome values obtained based on a plurality of first values sampled by the clock and a plurality of second values sampled by the reference clock, at a predefined number of edges of the data pattern; obtain a skew calibration code corresponding to the first PI code, from a binary variable, wherein the binary variable is obtained by accumulating an encoded variable generated based on the count of the skew in the de-serialized data word, to a previously generated binary variable; and calibrate the skew in the clock by performing one of a positive phase shift or a negative phase shift to the clock based on the skew calibration code, to align edges of the clock with the edges of the data pattern and edges of the reference clock.

BRIEF DESCRIPTION OF THE DRAWINGS

The above and other aspects, features and advantages of certain embodiments of the disclosure will be more apparent from the following description, taken in conjunction with the accompanying drawings in which.

DETAILED DESCRIPTION

Figure 1:
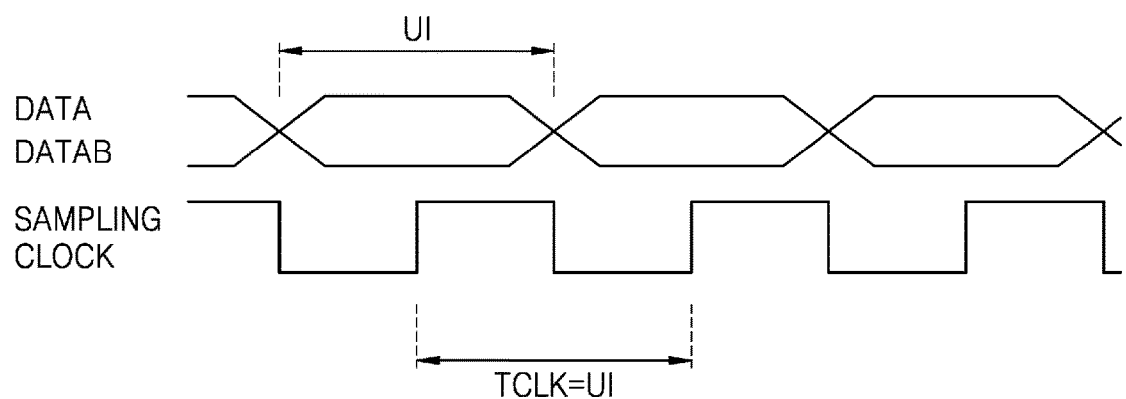
FIG. 1 depicts an example full-rate sampling clock used for recovering a data pattern.
Figure 2:
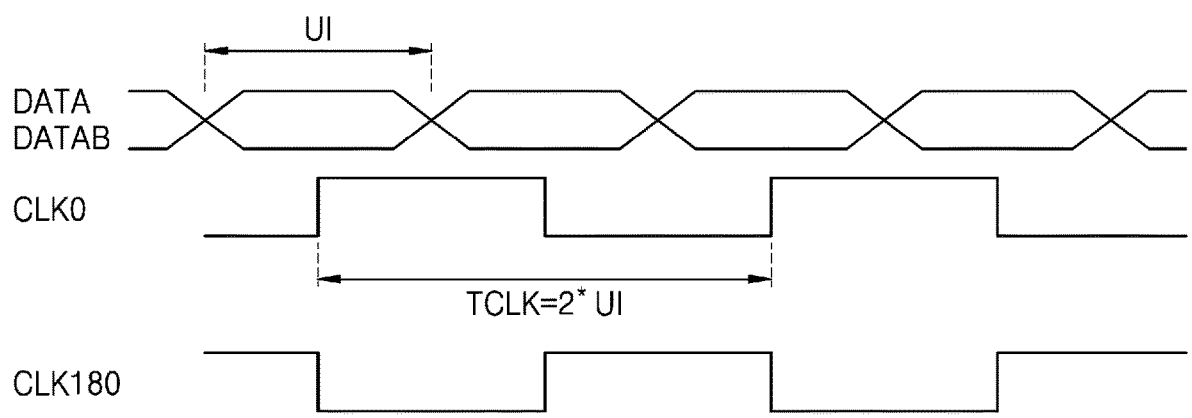
FIG. 2 depicts an example of half-rate sampling clocks used for recovering a data pattern.
Figure 3:
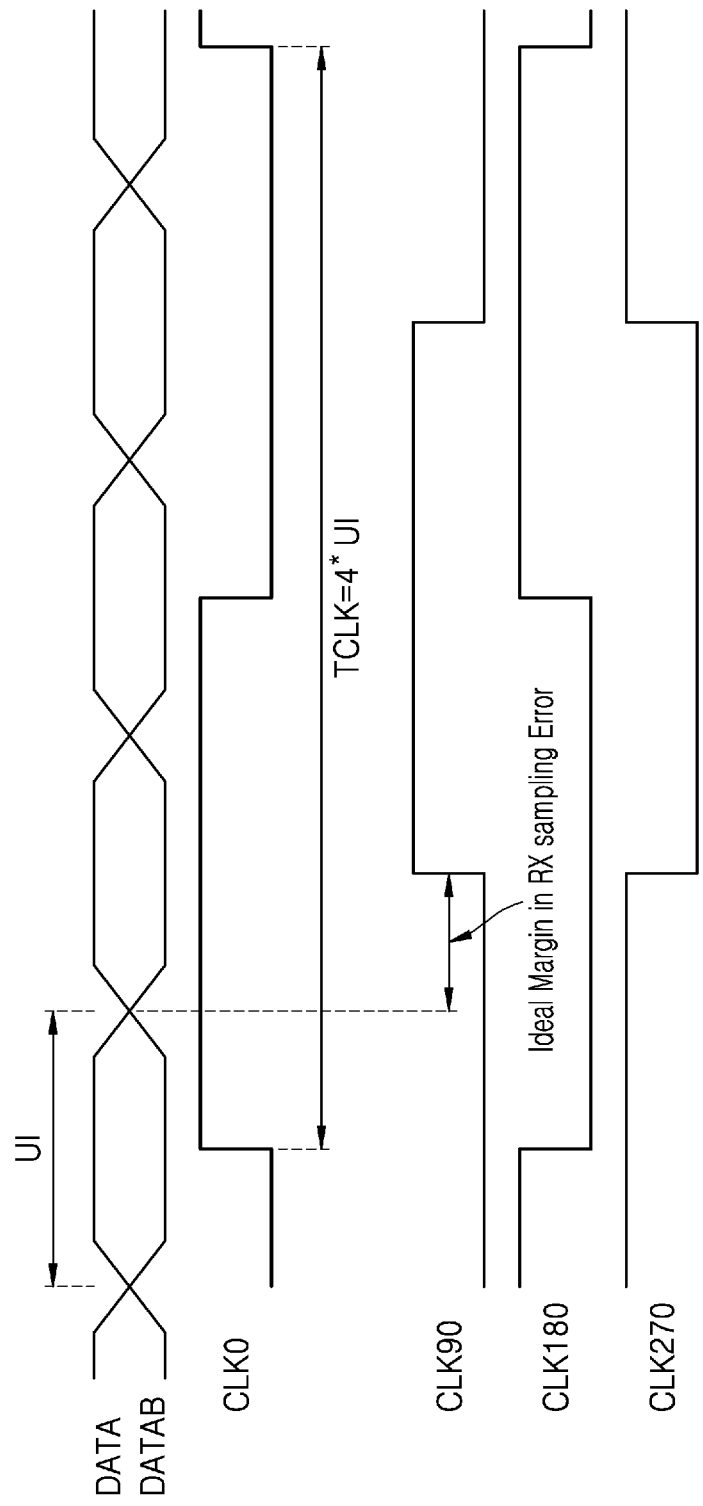
FIG. 3 depicts an example of quarter-rate sampling clocks used for recovering a data pattern.
Figure 4:
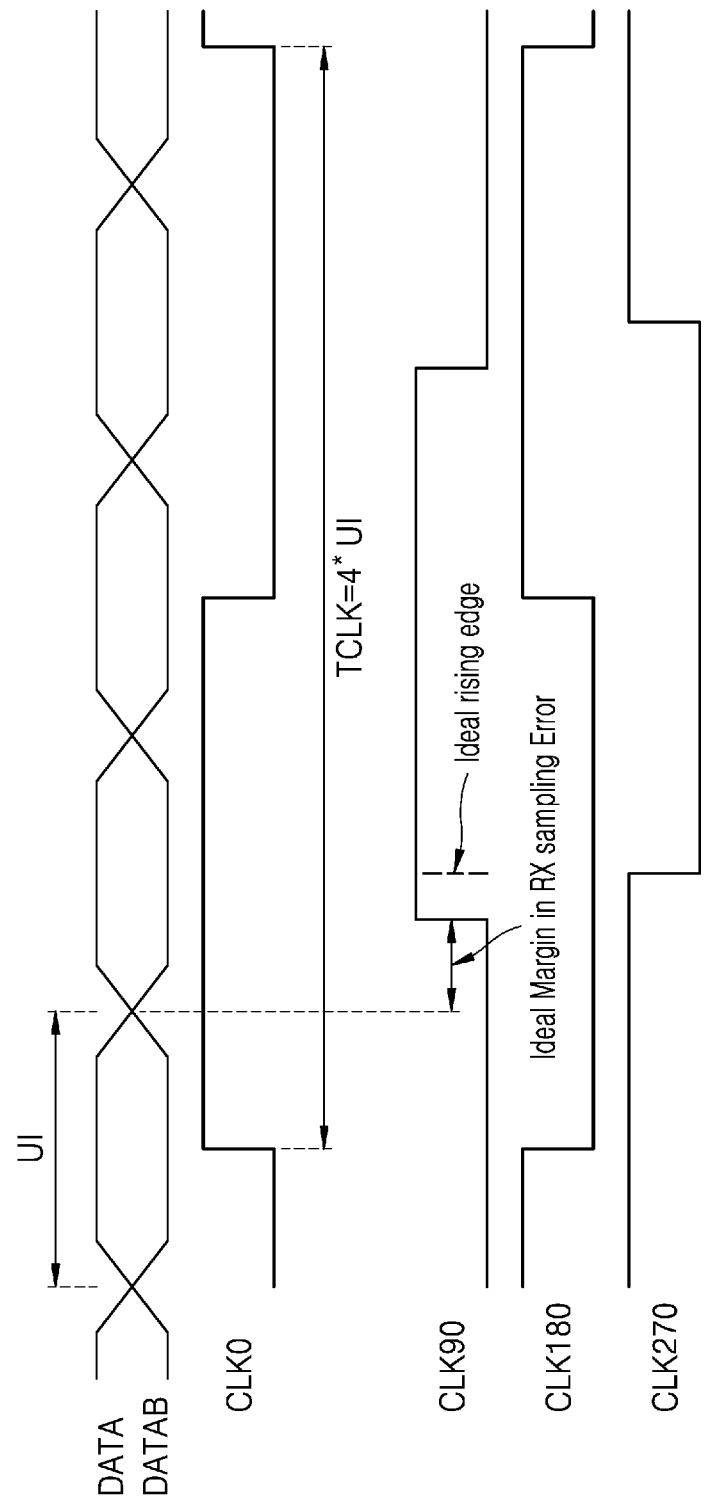
FIG. 4 depicts an example reduction of sampling error margin due to skew in one of the quarter-rate sampling clocks.

The embodiments herein and the various features and advantageous details thereof are explained more fully with reference to the non-limiting embodiments that are illustrated in the accompanying drawings and detailed in the following description. Descriptions of well-known components and processing techniques are omitted so as to not unnecessarily obscure the embodiments herein. The examples used herein are intended merely to facilitate an understanding of ways in which the embodiments herein may be practiced and to further enable those of skill in the art to practice the embodiments herein. Accordingly, the examples should not be construed as limiting the scope of the embodiments herein.

Embodiments herein disclose methods and systems for performing clock skew calibration in a receiver. Embodiments herein perform clock skew calibration by detecting presence of skews in clock signals with respect to a reference clock signal, wherein the reference clock signal is aligned to a data pattern generated at a particular Phase Interpolator (PI) code. Embodiments herein adjust the phase of the clock signals based on skew calibration codes, to align the clock signals with the reference clock signal. Embodiments herein detect the presence of skew in each of the clock signals based on values sampled by the each of the clock signals and the reference clock signal at a predefined number of the edges of the data pattern. Embodiments herein generate words corresponding to each of the clock signals, wherein the words indicate whether the skew present in each of the clock signals is a positive skew or a negative skew. The determination of whether the skews are positive or negative is based on the values sampled by the each of the clock signals and values sampled by the reference clock signal, at the predefined number of edges of the data pattern.

Embodiments herein generate skew calibration codes, corresponding to each PI code, for each of the clock signals, based on encoded variables, wherein the encoded variables are generated based on the words corresponding to each of the clock signals. Embodiments herein compute an average of the skew calibration codes, corresponding to each of the PI codes, for each of the clock signals, wherein the clock signals are aligned to the reference clock signal based on the corresponding average skew calibration codes for calibrating the detected skews.

Hereinafter, one or more embodiments of the disclosure will be described in more detail with reference to FIGS. 5 and 13. In the accompanying drawings, similar reference numerals or characters denote corresponding features consistently throughout the drawings.

Figure 5:
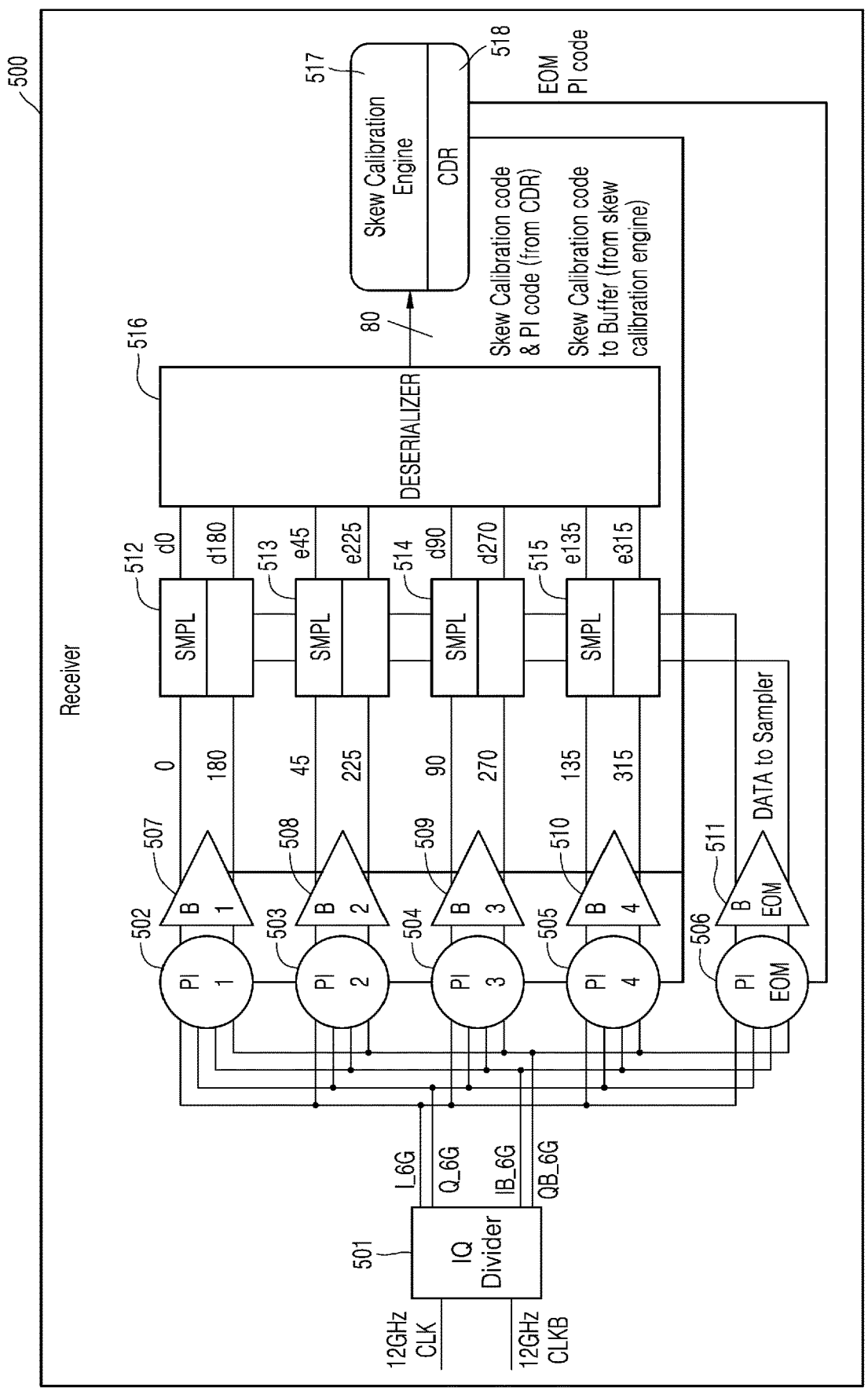
FIG. 5 depicts an example of a receiver configured to detect skews in clock signals with respect to a reference clock signal and calibrate the detected clock skews, according to an embodiment.

FIG. 5 depicts an example of a receiver 500 configured to detect skews in clock signals and calibrate the detected clock skews, according to an embodiment. The receiver 500 is configured to detect skews in a plurality of clock signals with respect to a reference clock signal, and calibrate the detected skews prior to receiving actual data, which is transmitted from a transmitter. The receiver 500 is configured to receive high-speed data (data sequences having high data rates). As the components of the receiver 500 operate at a lower data rate, the receiver 500 uses a plurality of clock signals for sampling the high-speed data at different phases.

Figure 6:
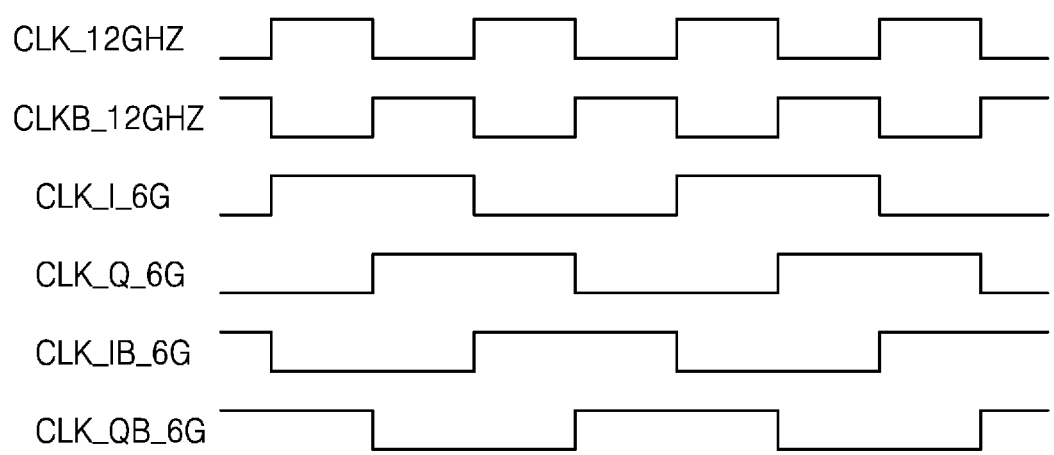
FIG. 6 depicts an example of the clock patterns generated at input terminals and output terminals of an In-phase Quadrature-phase (IQ) divider in a receiver, according to an embodiment.

The receiver 500 includes an In-phase Quadrature-phase (IQ) divider 501, which receives a clock pattern and a complement of the clock pattern. FIG. 6 is an example depicting the signals at the input terminals and the signals at the output terminals of the IQ divider 501. The clock pattern and the complement of the clock pattern are provided as inputs to the IQ divider 501. The clock pattern is referred to as CLK and the complement of the clock pattern is referred to as CLKB. In an example, the clock rate of the clock pattern may be provided at 12 GHz as inputs to the IQ divider 501. The IQ divider 501 may alter the phase and the frequency of the clock pattern (CLK) and the complement of the clock pattern (CLKB) to generate four clock patterns as outputs. For example, the clock rate of the four output clock patterns may be 6 GHz. The four clock patterns are referred to as CLK I-6G, CLK Q-6G, CLK IB-6G, and CLK QB-6G.

In the example, the receiver 500 generates eight clock signals using four Phase Interpolator codes (PIs) (e.g., PI-1 502, PI-2 503, PI-3 504, and PI-4 505). The eight clocks are generated using the four clock patterns CLK I-6G, CLK Q-6G, CLK IB-6G, and CLK QB-6G, which are provided as inputs to each of PI-1 502, PI-2 503, PI-3 504, and PI-4 505. Since transmitters and receivers employ differential signals, each of the four PIs, e.g., PI-1 502, PI-2 503, PI-3 504, and PI-4 505, may generate complementary clock signal pairs. The four PIs (PI-1 502, PI-2 503, PI-3 504, and PI-4 505) vary the phases of the four clock patterns (CLK I-6G, CLK Q-6G, CLK IB-6G, and CLK QB-6G) to generate the eight clock signals. The phases of the four clock patterns are varied based on PI codes provided to PI-1 502, PI-2 503, PI-3 504, and PI-4 505, by a Clock and Data Recovery (CDR) 518.

The receiver 500 is configured to generate a data pattern. The data pattern is generated at a particular PI code. The particular PI code is an Eye-Opening Margin (EOM) PI code. The EOM PI code can be provided to a PI EOM 506 by the CDR 518. The CDR 518 changes the EOM PI code for varying the phase of the data pattern. The skews in the clock signals are calibrated using the data pattern prior to utilizing the clock signals for sampling actual data sequences. The PI EOM 506 can generate two data patterns, wherein the data patterns are complementary to each other and form a differential signal pair.

Figure 7:
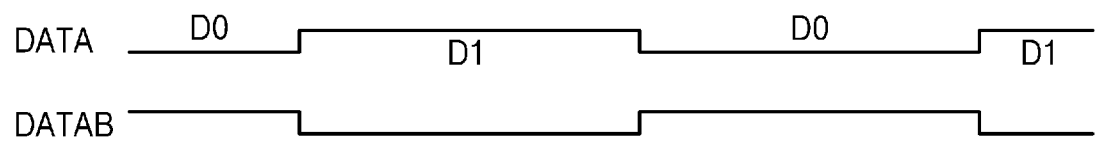
FIG. 7 depicts an example of data patterns generated by a receiver for detecting skews in clock signals with respect to a reference clock signal, according to an embodiment.

FIG. 7 is an example of the complementary data patterns generated by PI EOM 506. The two complementary data patterns are referred to as DATA and DATAB.

The phase differences between the clock signals, generated by the PI-1 502 to PI-4 505, depend on the number of clock signals utilized by the receiver 500. As eight clock signals are utilized by the receiver 500 for sampling the data pattern (and later actual data), the PI codes sent to PI-1 502 to PI-4 505 may cause the minimum phase difference between two clock signals to vary by 45 degrees. The phase of the clock signal that is generated by PI-1 502 may be at 0 degrees and referred to as CLK 0. The phase differences of other clock signals, generated by respective PI-2 503, PI-3 504, and PI-4 505, may be relative to the phase of CLK 0.

As the PI-1 502 to PI-4 505 can generate complementary clock signal pairs, the phase difference between CLK 0 and the clock signal complementary to the CLK 0 (generated by PI-1 502) is 180 degrees. The clock signal complementary to the CLK 0 can be referred to as CLK 180. The complementary clock signals generated by PI-2 503 can be referred to as CLK 45 and CLK 225. The phase difference between the clock signal CLK 45 and CLK 0 is 45 degrees. The phase difference between the clock signal CLK 225 and CLK 0 is 225 degrees. The complementary clock signals generated by PI-3 504 can be referred to as CLK 90 and CLK 270. The phase difference between the clock signal CLK 90 and CLK 0 is 90 degrees. The phase difference between the clock signal CLK 270 and CLK 0 is 270 degrees. The complementary clock signals generated by PI-4 505 can be referred to as CLK 135 and CLK 315. The phase difference between the clock signal CLK 135 and CLK 0 is 135 degrees. The phase difference between the clock signal CLK 315 and CLK 0 is 315 degrees.

Figure 8:
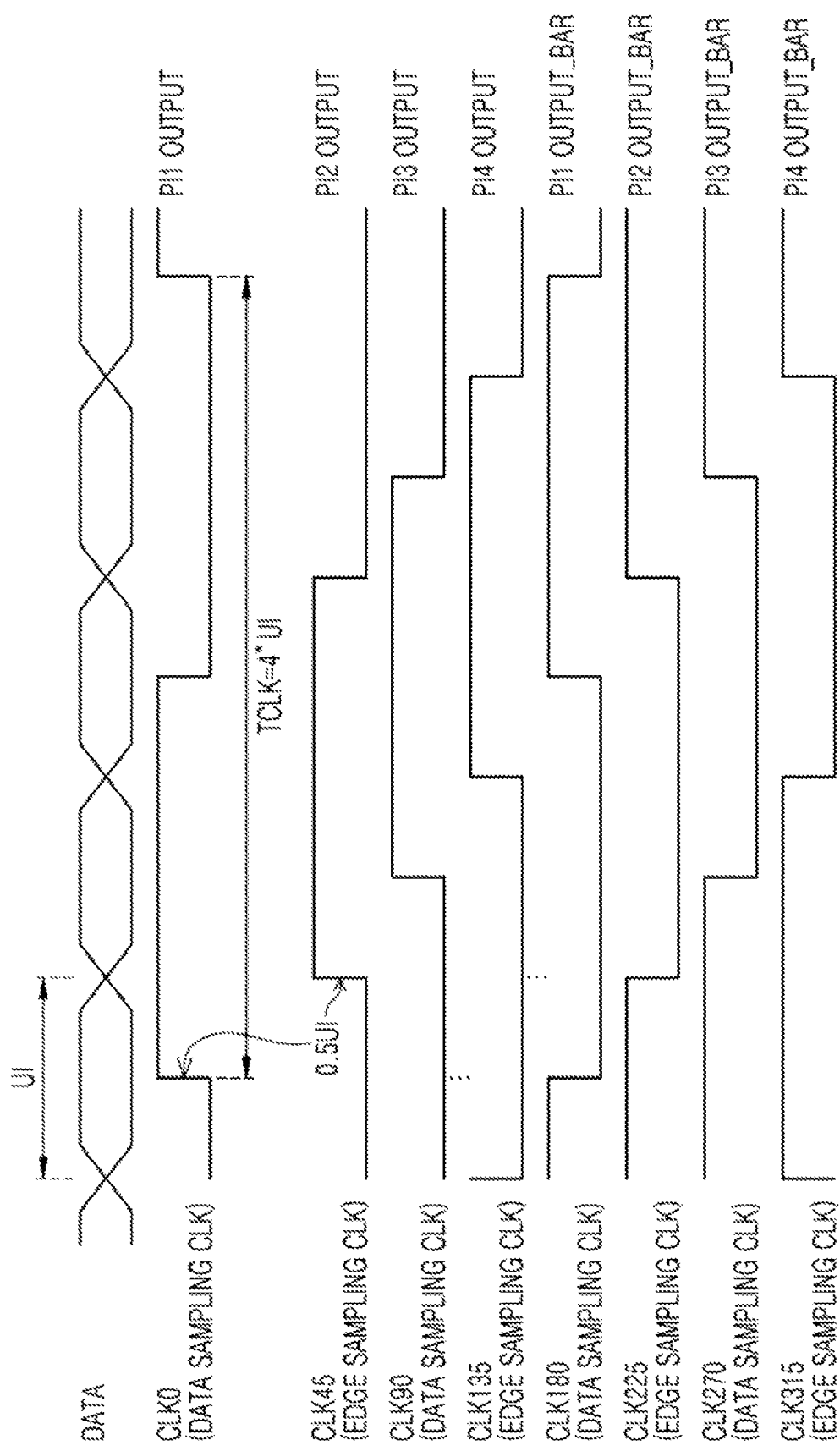
FIG. 8 depicts an example of relative positions of clock signals with respect to a clock signal used for sampling data pulses of data patterns, according to an embodiment.

FIG. 8 is an example of the relative positions of clock signals with respect to CLK 0.

In an embodiment, if the receiver receives a data sequence (DATA) and a complementary of the data sequence (DATAB), at a data rate of 24 Gbps (Giga-bits per second), the eight clock signals (with a clock rate of 6 GHz) can be considered as quarter-rate clock signals. The clock rate of the clock signals CLK (0-315) is quarter of the data rate of the data sequence. If bit period of the data sequence is referred to as a Unit Interval (UI), the time period of the clock signals CLK (0-315) is 4*UI. As depicted in FIG. 8, the quarter-rate clock signals can be used by the samplers 512, 513, 514 and 515 (shown in FIG. 5), to sample edges of the pulses of the data sequence or centers of the pulses of the data sequence.

The positive edges of the clock signals CLK (0-315) are used by the samplers (512-515) to sample either the edges of the pulses of the data sequence or the centers of the pulses of the data sequence. The positive edges of the clock signals CLK 0, CLK 90, CLK 180 and CLK 270, are used by the samplers 512, 513, 514 and 515 to sample the centers of the pulses of the data sequence. Therefore, the clock signals CLK 0, CLK 90, CLK 180 and CLK 270, are referred to as data sampling clock signals. The positive edges of the clock signals CLK 45, CLK 135, CLK 225 and CLK 315 are used by the samplers 512, 513, 514 and 515, to sample the edges of the pulses of the data sequence. Therefore, the clock signals CLK 45, CLK 135, CLK 225 and CLK 315 are referred to as edge sampling clock signals.

The PI code provided by the CDR 518 to generate CLK 0 can be considered as the reference PI code. The PI codes used by PI-2 503, PI-3 504 and PI-4 505 are relative to the PI code used by PI-1 502 to generate CLK 0. For example, if the PI code provided to PI-1 502 for generating CLK 0 is code-1, then the PI code provided to PI-2 503 for generating CLK 45 is an accumulation of the code-1 and code-x, wherein the code-x creates an offset of 0.5*U1 with respect to the code-1. Similarly, the PI code provided to PI-3 504 for generating CLK 90 is an accumulation of the code-1 and code-y, wherein the code-y creates an offset of 1*U1 with respect to the code-1; and the PI code provided to PI-4 505 for generating CLK 135 is an accumulation of the code-1 and code-z, wherein code-z creates an offset of 1.5*U1 with respect to the code-1.

As CLK 0 and CLK 180 are complementary to each other, the PI code required to generate CLK 180 is an accumulation of the code-1 and a code required to create an offset of 2*U1 with respect to the code-1. As CLK 45 and CLK 225 are complementary to each other, the PI code required to generate CLK 225 is an accumulation of the code-1, the code-x and a code required to create an offset of 2*U1 with respect to the accumulation of the code-1 and the code-x. As CLK 90 and CLK 270 are complementary to each other, the PI code required to generate CLK 270 is an accumulation of the code-1, the code-y and a code required to create an offset of 2*U1 with respect to the accumulation of the code-1 and the code-y. As CLK 90 and CLK 315 are complementary to each other, the PI code required to generate CLK 315 is an accumulation of the code-1, the code-z and a code required to create an offset of 2*U1 with respect to the accumulation of the code-1 and the code-z.

When the CDR 518 changes a particular PI code (for example code-1) for locking one of the clock signals to an edge or a center of a pulse of the data sequence, the remaining PI codes (such as accumulation of code-1 and code (x/y/z)) change together for maintaining a fixed phase difference (e.g., 45, 90, 135, 180, 225, 270, 315 degrees with respect to CLK 0) amongst the clock signals. However, the phase differences between the clock signals are likely to vary randomly from device to device (receiver to receiver) due to variations in the manufacturing processes. In the receiver 500, such variations in the phase differences amongst the clock signals are primarily contributed by a delay variation of the paths traversed by the clock signals, e.g., the path between the IQ divider 501 and PI-(1-4) (502-505) and the path between the PI-(1-4) (502-505) and the samplers (512-515); and PI code dependent variation, e.g., non-linearity in the PI-(1-4) (502-505). This delay can contribute to skews in the clock signals CLK 0-CLK 315.

Figure 9:
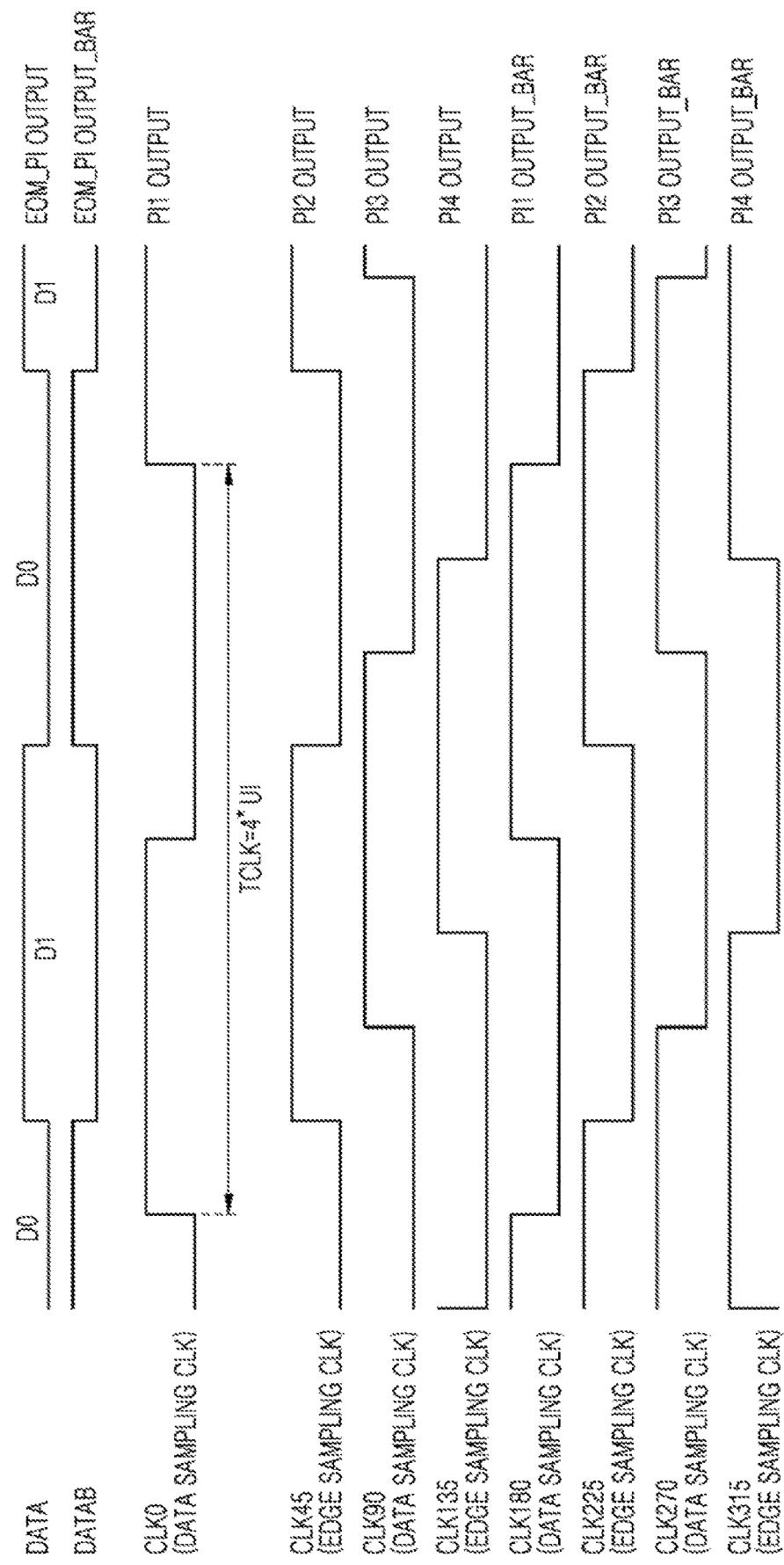
FIG. 9 depicts an example of relative positions of clock signals, including a reference clock signal, with respect to data patterns, according to an embodiment.

FIG. 9 is an example of the relative positions of the clock signals CLK 0-CLK 315 with respect to the data pattern generated by the PI EOM 506. The two complementary data patterns (DATA and DATAB) can have values D0 (low or binary or D1 (high or binary 1). As depicted in FIG. 9, the data sampling clock signals, e.g., CLK 0, CLK 90, CLK 180 and CLK 270, are utilized by the samplers 512, 513, 514 and 515 respectively, to sample data, e.g., D0 or D1. The positive edges of the clock signals CLK 0, CLK 90, CLK 180 and CLK 270 are used for sampling data. However, the edge sampling clock signals can also be utilized for sampling data. In this example, the positive edges of the edge sampling clock signals CLK 135 and CLK 315 are used by the sampler 515 to sample D1 and D0 respectively. The positive edges of the edge sampling clock signals CLK 45 and CLK 225 are utilized by the sampler 513 for sampling the edges of the complementary data patterns. The sampler 513 utilizes CLK for sampling the rising edges and CLK 225 for sampling the falling edges of the data pattern DATA. The sampler 513 utilizes CLK 45 for sampling the falling edges and CLK 225 for sampling the rising edges of the data pattern DATAB.

When the clock rate of the of the complementary data patterns and the clock rate of the clock signals are the same, e.g., 6 GHz, the PI code provided by the CDR 518 to the PI EOM 506 for generating the data patterns (DATA and DATAB) may be such that the edge sampling clock signals CLK 135 and CLK 315 are used by the sampler 515 to sample the edges of the complementary data patterns. The edge sampling clock signals CLK 45 and CLK 225 are used by the sampler 513 to sample data. For example, the edge sampling clock signals for sampling the edges of the complementary data patterns can be considered as reference clock signals (e.g., CLK and CLK 225). The reference clock signals may be used to detect the presence of skews in the data sampling clock signals (e.g., CLK 0, CLK 90, CLK 180 and CLK 270) and the edge sampling clock signals for sampling data in the complementary data patterns (e.g., CLK 135 and CLK 315). This is because the edges of the reference clock signals (e.g., CLK 45 and CLK 225) are locked to the edges of the complementary data patterns. In order to determine the edge sampling clock signals for sampling the edges of the complementary data patterns, the CDR 518 can utilize the data sampling clock signals.

As the phase difference between the data sampling clock signals CLK 0 and CLK 90 is 90 degrees, the CDR can perform an exclusive OR (XOR) operation between the values sampled by the samplers 512 and 514 to determine whether the edge sampling clock signal CLK 45 is sampling the edges of the data patterns. Similarly, as the phase difference between the data sampling clock signals CLK 90 and CLK 180 is 90 degrees, the CDR can perform an XOR operation between the values sampled by the samplers 514 and 512 to determine whether the edge sampling clock signal CLK 135 is sampling the edges of the data patterns. If the result of XOR is 1, the edge sampling clock signal (e.g., CLK 45 or CLK 225) between the data sampling clock signals ((CLK 0 and CLK 90) or (CLK 90 and CLK 180)) is sampling the edges of the data patterns. If it is determined (based on the XOR operation) that CLK 45 is sampling the edges of the data patterns, then it implies that CLK 135 is sampling the data (D0 or D1) in the data patterns. If it is determined that CLK 135 is sampling the edges of the data patterns, then it implies that CLK 45 is sampling D0 or D1 in the data patterns. Further, if it is determined that CLK 45 is sampling the edges of the data patterns, then it implies that CLK 225 is also sampling the edges of the data patterns. Similarly, if it is determined that CLK 135 is sampling the edges of the data patterns, then it implies that CLK 315 is also sampling the edges of the data patterns. In this example, the edge sampling clock signals CLK 45 and CLK 225 can be utilized by the CDR as reference clock signals as the positive edges of CLK 45 and CLK 225 are locked to the edges of the complementary data patterns generated by the PI EOM 506 at a particular EOM PI code.

The CDR 518 can freeze the values sampled by the samplers 512 and 514 using the data sampling clock signals. This allows the CDR 518 to lock the data sampling clock signals to their original positions with respect to the data patterns if the CDR 518 updates the EOM PI code.

Figure 10:
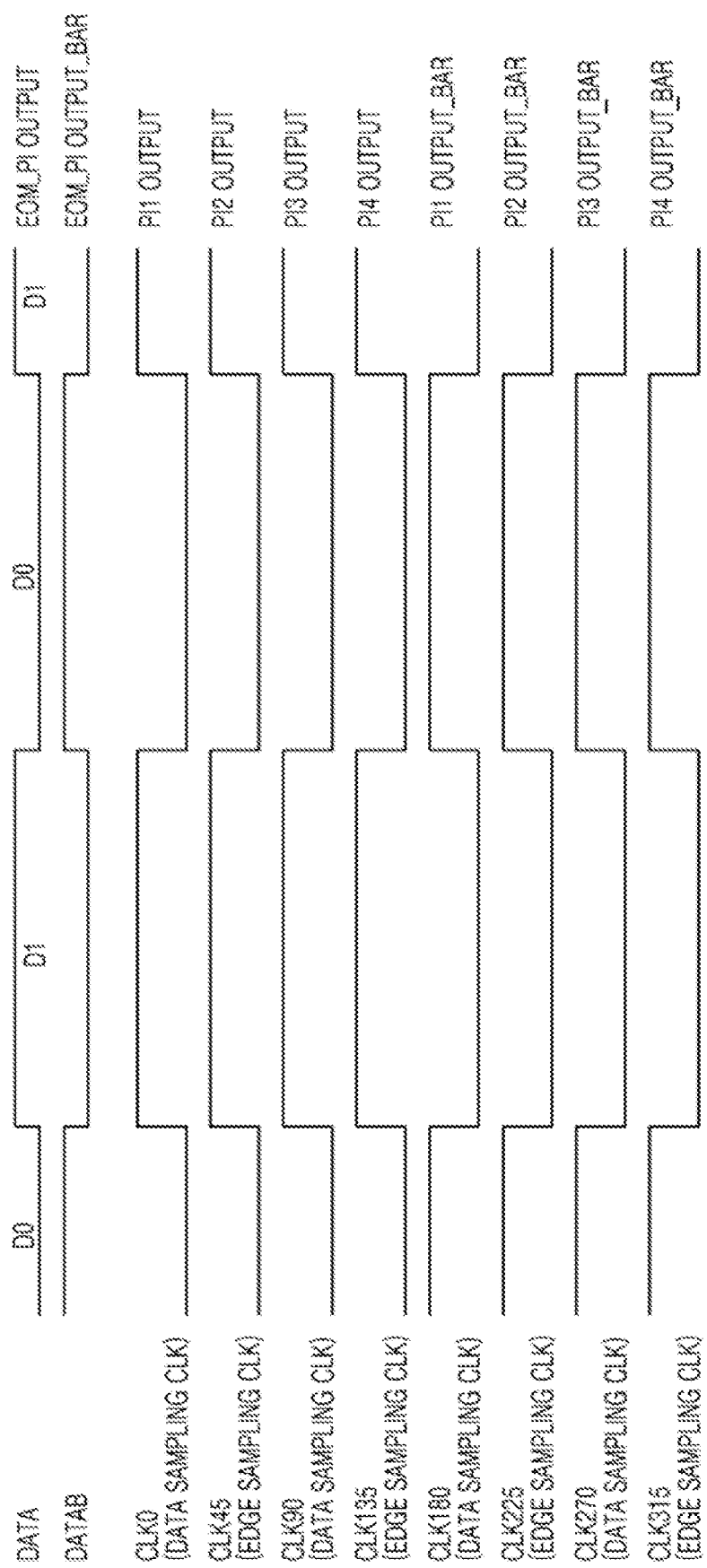
FIG. 10 depicts an example of locking of all clock signals and the reference clock signal by varying Phase Interpolator (PI) codes, according to an embodiment.

FIG. 10 depicts locking of the data sampling clock signals and the edge sampling clock signals (sampling D0 or D1 in the complementary data patterns) with the reference clock signals CLK 45 and CLK 225. The locking of the clock signals (CLK 0, CLK 90, CLK 135, CLK 180, CLK 270 and CLK 315) with the reference clock signals (CLK 45 and CLK 225) facilitate skew detection. The CDR 518 can vary the PI codes sent to PI-1 502, PI-3 504, and PI-4 505, to ensure that CLK 0, CLK 90, CLK 135 are locked to CLK 45, and CLK 180, CLK 270 and CLK 315 are locked to CLK 225. Once the locking is completed, all clock signals sample the edges of the complementary data patterns. If there is a skew present in any of the clock signals, the clock signals will not be locked to the reference clock signal (considering the edges of the reference clock signal are locked to the edges of the complementary data patterns). Thus the calibrating mentioned above (also see FIG. 5) includes aligning edges of a reference clock to edges of a complementary data pattern.

The skews present in the clock signals are calibrated by locking the clock signals with a reference clock signal, as the edges of the reference clock signal are locked to the complementary data patterns. The calibration is achieved by generating skew calibration codes, wherein the skew calibration codes are used for adjusting the phases of the clock signals incrementally, such that the clock signals are locked to the reference clock signal, and, thereby, the complementary data patterns.

Figure 11:
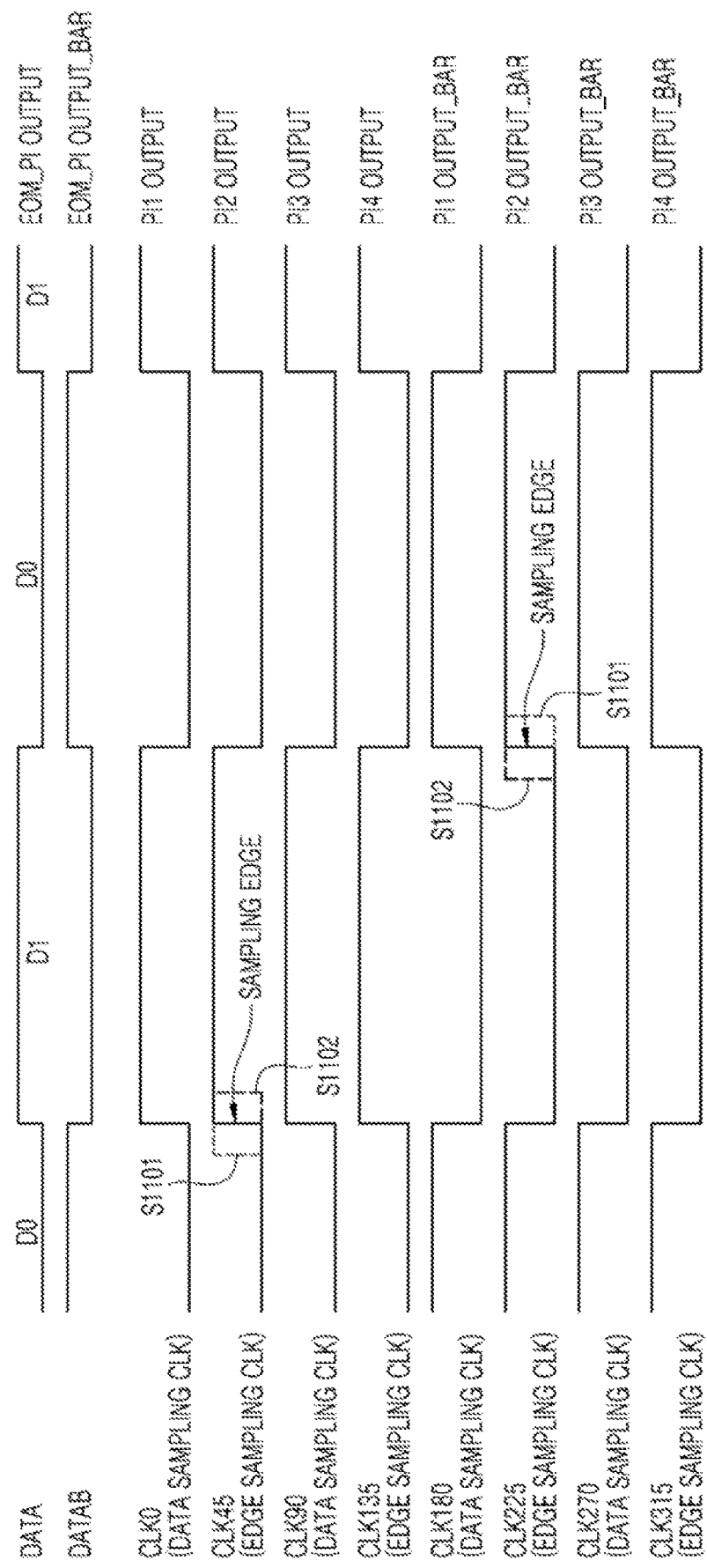
FIG. 11 depicts an example of detecting skew in a clock signal with respect to a reference clock signal using the reference clock signal, according to an embodiment.

In an embodiment, assuming that CLK 45 is the reference clock signal, the receiver 500 aims at locking the other seven clock signals with the reference clock signal CLK 45. FIG. 11 depicts an example of detecting skew in CLK 225 with respect to CLK 45. The skew can be a positive skew or a negative skew. The skew can be detected based on values sampled by the positive edges of CLK 45 and CLK 225. Based on the logic of the CDR 518, if the skew is positive, CLK 45 samples the data patterns earlier and CLK 225 samples the data patterns later (indicated S1101). Similarly, if the skew is negative, CLK 45 samples the data patterns later and CLK 225 samples the data patterns earlier (indicated S1102).

In an embodiment, the skew can be detected using a skew calibration engine 517. The skew calibration engine 517 can use the values sampled (by the sampler 513) at the positive edges of CLK 45 and CLK 225 corresponding to the edge of the data patterns, to determine whether there is a skew, and whether the skew is positive or negative. The skew calibration engine 517 can perform a logical complement of an exclusive NOR (XNOR) operation on the values sampled by the positive edges of CLK 45 and CLK 225 at the edge of the data pattern DATA. If the XNOR of the values sampled by the positive edges of CLK 45 and CLK 225 are the same, then skew is detected to be present. If the XNOR of the values sampled by the positive edges of CLK 45 and CLK 225 are different, then it is determined that skew is not present. If the XNOR of values sampled by the positive edges of CLK 45 and CLK 225 at the edge of DATA is 0, e.g., D0, the skew is determined as positive. If the XNOR of values sampled by the positive edges of CLK 45 and CLK 225 at the edge of DATA is 1, e.g., D1, the skew is determined as negative.

Similarly, the skew calibration engine 517 can perform an XNOR operation on the values sampled by the positive edges of CLK 45 and CLK 225 at the edge of the data pattern DATAB (complement of DATA). If the XNOR of values sampled by the positive edges of CLK 45 and CLK 225 at the edge of DATAB is 1, e.g., D1, the skew is determined as positive. If the XNOR of values sampled by the positive edges of CLK 45 and CLK 225 at the edge of DATAB is 0, e.g., D0, the skew is determined as negative.

The reference clock signal CLK 45 can be utilized for detecting the presence of skew in CLK 180, CLK 270 and CLK 315. Once the skew in CLK 225 calibrated using the reference clock signal CLK 45, CLK 225 can be utilized for detecting the presence of skew in CLK 0, CLK 90 and CLK 135 and calibrating the detected skews present in CLK 0, CLK 90 and CLK 135.

Figure 12:
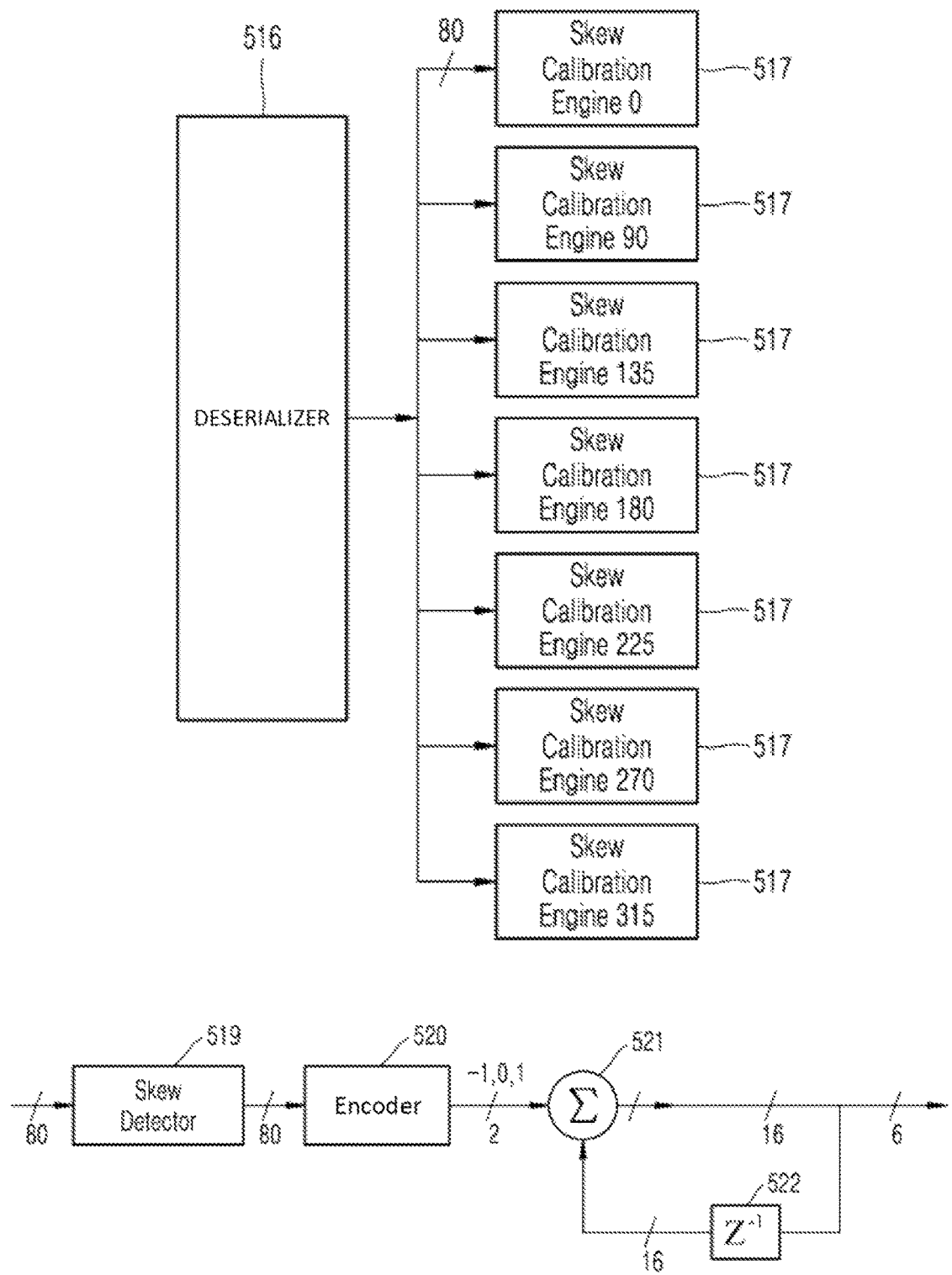
FIG. 12 depicts an example of units of a skew calibration engine configured to detect the presence of skews in clock signals with respect to a reference clock signal locked to complementary data patterns, according to an embodiment.

FIG. 12 depicts an example of units of the skew calibration engine 517 configured to detect the presence of skews in the clock signals with respect to a reference clock signal locked to a data pattern, according to an embodiment. As depicted in FIG. 12, the skew calibration engine 517 is interfaced with a deserializer 516. The skew calibration engine 517 includes a skew detector 519, an encoder 520, an accumulator 521, and a delay introducing block 522. The skew calibration engine 517 can detect skew in each of CLK 0, CLK 90, CLK 135, CLK 180, CLK 225, CLK 270 and CLK 315, with respect to the reference clock signal CLK 45 (considering CLK as the reference clock signal).

The detection of skew in CLK 180 with respect to CLK 45 and calibration of the detected skew will be described as follows. The detection of skews in each of CLK 225, CLK 270 and CLK 315 with respect to the reference clock signal CLK 45, and calibration of the detected skews, is identical to the detection and calibration of skew in CLK 180 with respect to CLK 45. The detection of skews in CLK 0, CLK 90 and CLK 135 with respect to CLK 225 (after detection and calibration of skew in CLK 225 with respect to CLK 45) and calibration of the detected skews is also identical to the detection and calibration of skew in CLK 180 with respect to CLK 45.

The skew detector 519 can determine a presence of skew at a positive edge of CLK 180 with respect to a positive edge of CLK 45 based on XNOR operation (as described earlier) using a value sampled by the positive edge of CLK 180 and a value sampled by a positive edge of CLK 45 at an edge of one of the data pattern (for simplifying the description, the data pattern DATA is used as an example). The outcome of the determination is a positive skew, a negative skew, or an absence of skew. Once, the outcome at the positive edge of CLK 180 with respect to a positive egde of CLK 45 is determined, the skew detector 519 can determine whether there is a skew at a predefined number of successive positive edges of CLK 180 with respect to a predefined number of successive positive edges of CLK 45.

For example, the skew detector 519 can obtain 80 values sampled by consecutive positive edges of CLK 180 and 80 values sampled by 80 corresponding consecutive positive edges of CLK 45, at 80 consecutive edges of the data pattern (DATA). The skew detector 519 can obtain the 80 values from the deserializer 516 to derive 80 outcomes using the XNOR operations. The skew detector 519 can provide the 80 outcomes as a deserialized data word to the encoder 520. However, the one or more embodiments are not limited thereto, and the skew detector 519 may obtain more or less than 80 sample values.

The encoder 520 can generate an encoded variable based on the deserialized data word. For example, the encoder 520 can determine a count of positive skew outcomes, a count of negative skew outcomes, and a count of absence of skew outcomes, from the 80 outcomes indicated in the deserialized data word. The encoder 520 can generate encoded variables based on the counts. In an embodiment, the encoded variable generated by the encoder 520 is a positive binary one, if the count of the positive skew outcomes indicated in the de-serialized data word is greater than the count of the negative skew outcomes indicated in the de-serialized data word. The encoded variable generated by the encoder 520 is a negative binary one, if the count of the positive skew outcomes indicated in the de-serialized data word is less than the count of the negative skew outcomes indicated in the de-serialized data word. The encoded variable generated by the encoder 520 is zero, if the count of the positive skew outcomes indicated in the de-serialized data word is equal to the count of the negative skew outcomes indicated in the de-serialized data word.

The encoder 520 can provide the generated encoded variable (positive binary one, negative binary one and zero) to the accumulator 521. Initially, the accumulator 521 accumulates the encoded variable to 0 to generate a binary variable. It may be noted that the accumulator 521 may accumulate the encoded variable with a previously generated binary variable. The previously generated binary variable may have been obtained based on previously generated encoded variables, wherein the previously generated encoded variables were generated based on count of positive skew outcomes and count of negative skew outcomes, which were derived from preceding 80 outcomes indicated in a previous deserialized word. The previous 80 outcomes indicated in the previous deserialized word may have been derived based on determination of presence of skews in 80 preceding positive edges of CLK 180 with respect to 80 preceding positive edges of CLK 45.

In an embodiment, the binary variable is a 16 bit binary number. The skew calibration engine 517 is configured to extract a skew calibration code from the binary variable. In an embodiment, six bits from the Most Significant Bits (MSBs) of the binary variable can be extracted from the binary variable to create the skew calibration code. The skew calibration engine 517 sends the skew calibration to a delay control buffer B-1 507 shown in FIG. 5. The delay control buffer B-1 507 can adjust the phase of CLK 180 (generated by PI-1 502), such that the skew is nullified. If positive skew has been detected, then B-1 507 introduces a negative phase shift to CLK 180. If negative skew has been detected, then B-1 507 introduces a positive phase shift to CLK 180. If skew has not been detected, then B-1 507 does not change the phase of CLK 180. Delay control buffers B-2 508, B-3 509, B-4 510 and B-EOM 511 are also shown in FIG. 5.

If positive skew is detected, the created skew calibration code will be greater than a previous skew calibration code (as the encoded variable accumulated to the binary variable is positive binary one), wherein the previous skew calibration code was generated based on detection of positive skew in CLK 180 using the preceding 80 positive edges of CLK 180. Similarly, if negative skew is detected, then the created skew calibration code will be less than the previous skew calibration code (as the encoded variable accumulated to the binary variable is negative binary one). If skew is not detected, then the created skew calibration code will be equal to the previous skew calibration code (as the encoded variable accumulated to the binary variable is zero). The B-1 507 can introduce the phase shift (negative or positive) based on the created skew calibration code.

Once the phase shift is introduced (that is, if skew is detected) in CLK 180, the sampler 512 can sample DATA using CLK 180 and the sampler 513 can sample DATA using CLK 45. The skew calibration engine 517 can perform skew detection by performing XNOR operations using 80 successive values sampled by 80 consecutive positive edges of CLK 180 and 80 successive values sampled by 80 corresponding consecutive positive edges of CLK 45, at 80 consecutive edges of DATA. If the skew detector 519 does not detect the presence of skew, then the edges of CLK 180 is locked to the edges of the reference clock signal CLK 45. In this instance, the created skew calibration code is the skew calibration code for CLK 180 pertaining to the EOM PI code used for generating the data pattern, e.g., DATA.

On the other hand, if the skew detector 519 detects the presence of skew in CLK 180, the skew detector 519 can generate a deserialized word based on the outcomes of skew detection and the encoder can generate encoded variables to create another skew calibration code. The skew calibration code is provided to B-1 507 to introduce an appropriate phase shift. This cycle of introducing phase shift continues until the edges of CLK 180 are locked to the edges of the reference clock signal CLK 45.

Similarly, skew calibration codes can be generated for locking the edges of CLK 0, CLK 90, CLK 135, CLK 225, CLK 270 and CLK 315 to the edges of the reference clock signal CLK 45. These skew calibration codes correspond to the EOM PI code used for generating the data pattern, e.g., DATA.

The skew calibration engine 517 can generate skew calibration codes for all clock signals corresponding to all EOM PI codes. Each time the EOM PI code is changed by the CDR 518, the phase of the DATA and DATAB is updated. As the CDR 518 had frozen the values sampled using the data sampling clocks, e.g., CLK 0, CLK 90, CLK 180 and CLK 270, the CDR 518 can provide appropriate PI codes to PI-1 502 to PI-4 505 to lock the edges of all clock signals to the reference clock signal, and initiate skew detection, skew calibration code generation, and skew calibration, using the skew calibration codes for CLK 0, CLK 90, CLK 135, CLK 180, CLK 225, CLK 270 and CLK 315, with respect to CLK 45.

In an embodiment, the skew calibration engine 517 can compute an average of the skew calibration codes for all EOM PI codes, corresponding to each of CLK 0, CLK 90, CLK 135, CLK 180, CLK 225, CLK 270 and CLK 315. This allows compensation of the skew introduced due to non-linearity in the PI-1 502 to PI-4 505.

FIG. 5 shows example units of the receiver 500 according to an embodiment, but the one or more embodiments are not limited thereto. In other embodiments, the receiver 500 may include less or more number of units. Further, the labels or names of the units of the receiver 500 are used only for illustrative purpose and does not limit the scope of the disclosure. One or more units can be combined together to perform same or substantially similar function in the receiver 500.

Figure 13:
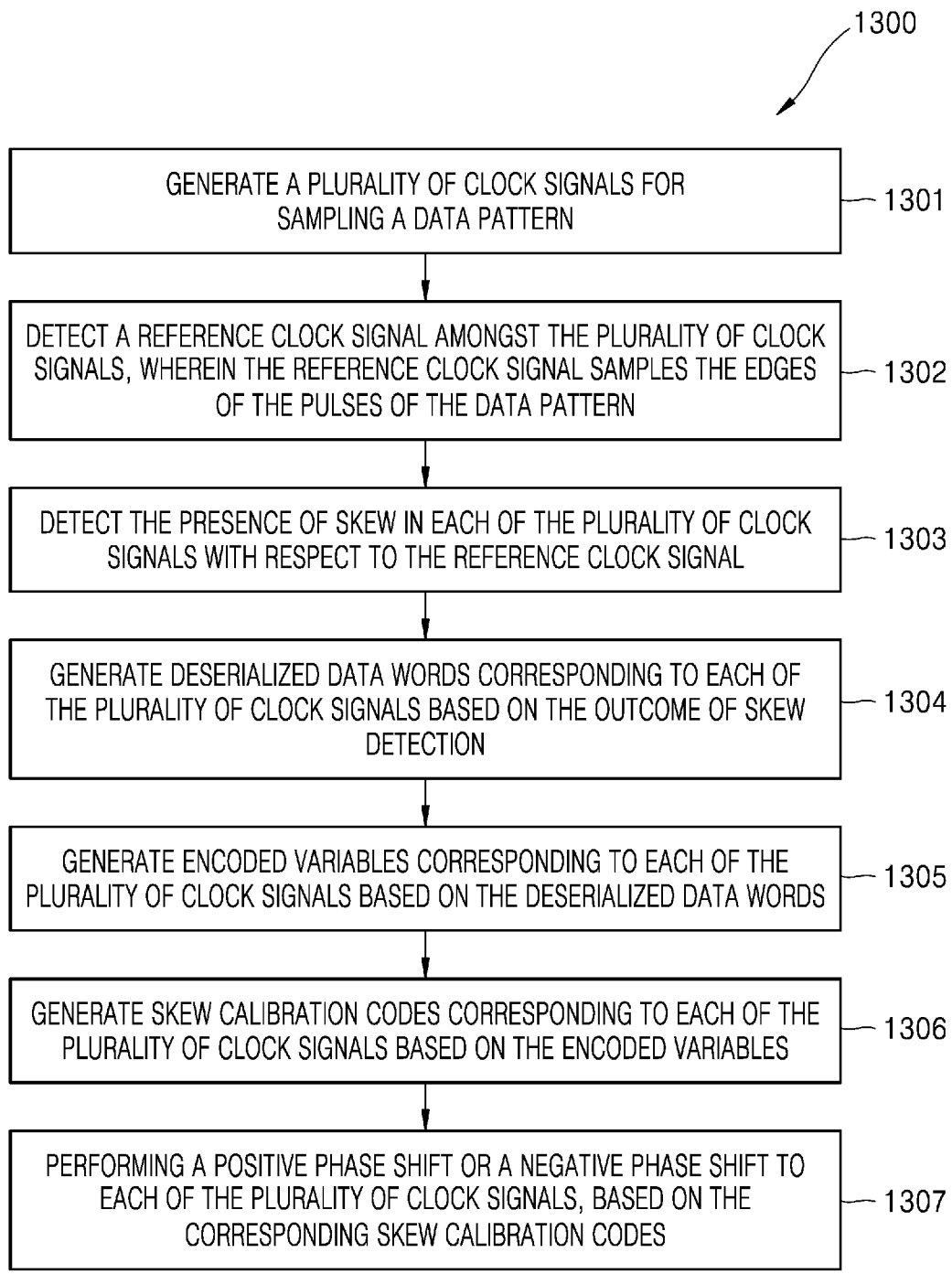
FIG. 13 is a flowchart depicting a method for performing clock skew calibration in a receiver, according to an embodiment.

FIG. 13 is a flowchart 1300 depicting a method for performing clock skew calibration in the receiver 500, according to an embodiment. At step 1301, the method includes generating a plurality of clock signals for sampling a data pattern. The receiver 500 introduces predefined phase differences between each of the plurality of clock signals based on PI codes provided by the CDR 518. In addition, a data pattern including data pulses for a first EOM PI code may be generated, wherein the pulse rate of the data pattern and the clock rates of each of the plurality of clock signals are the same.

At step 1302, the method includes detecting a reference clock signal amongst the plurality of clock signals, wherein the reference clock signal samples the edges of the pulses of the data pattern. The embodiments include sampling the edges of the pulses of the data pattern and the data represented by the pulses of the data pattern using the plurality of clock signals. The embodiments include determining the values obtained by sampling the data pattern based on each of the plurality of clock signals, the values including a value obtained by sampling the data pattern by the reference clock signal. The embodiments include freezing the values sampled by the clock signals. The embodiments include adjusting the phase of each of the plurality of clock signals, apart from the reference clock signal, using the PI codes provided by the CDR 518. The adjustment allows locking the edges of each of the plurality of clock signals with respect to the edges of the reference clock signal. The edges of the plurality of clock signals are locked to the edges of the reference clock signal, as the reference clock signal samples the edges of the pulses of the data sequence.

At step 1303, the method includes detecting the presence of skew in each of the plurality of clock signals with respect to the reference clock signal. The embodiments include detecting the presence of skew based on the values sampled by each of the plurality of clock signals and the reference clock signal at a predefined number of edges of the data pattern. For a particular clock signal, the embodiments include detecting the presence of skew based on determining that the value sampled by the clock signal and the value sampled by the reference clock signal at an edge of the data pattern is the same. The embodiments include detecting whether the detected skew is positive or negative based on the actual value (0 (D0) or 1 (D1)) sampled by the reference clock signal and the clock signal at the edge of the data pattern. The embodiments include detecting an absence of skew in the clock signal based on determining that the value sampled by the clock signal and the value sampled by the reference clock signal at the edge of the data pattern are different.

Once the presence or absence of skew is detected for each of the plurality of clock signals at the edge of the data pattern, the embodiments include detecting the presence or absence of skew in each of the plurality of clock signals based on the values sampled by each of the plurality of clock signals and the values sampled by the reference clock signal at the predefined number of edges of the data pattern.

At step 1304, the method includes generating deserialized data words corresponding to each of the plurality of clock signals based on the outcome of skew detection. For a particular clock signal, a deserialized data word is generated based on whether the outcome of skew detection at the predefined number of edges of the data pattern is positive skew, negative skew, or absence of skew. The deserialized data word indicates whether there is presence of positive skew, presence of negative skew, and absence of skew at the predefined number of edges the clock signal with respect to the reference clock signal. The embodiments include generating a deserialized data word corresponding to each of the plurality of clock signals (apart from the reference clock signal).

At step 1305, the method includes generating encoded variables corresponding to each of the plurality of clock signals based on the deserialized data words. For a particular clock signal, the embodiments include determining a count of positive skew and a count of negative skew indicated in the deserialized data word corresponding to the particular clock signal. The embodiments include generating encoded variables based on the count of positive skew and the count of negative skew. The embodiments include encoding a negative binary one if the count of positive skew in the deserialized data word is less than the count of negative skew. The embodiments include encoding a positive binary one if the count of positive skew in the deserialized data word is greater than the count of negative skew. The embodiments include encoding a zero if the count of positive skew in the deserialized data word is equal to the count of negative skew. The embodiments include generating encoded variables for each of the plurality of clock signals.

At step 1306, the method includes generating skew calibration codes corresponding to each of the plurality of clock signals based on the encoded variables. For a particular clock signal, the embodiments include generating a binary variable by accumulating the encoded variable, corresponding to the particular clock signal, with a previously generated binary variable. In an embodiment, the previously generated binary variable is obtained based on presence or absence of skew, detected in a previous predefined number of edges of the clock signal with respect to the reference clock signal. The embodiments include generating a skew calibration code by extracting a predefined number of bits from the generated binary variable. The embodiments include generating skew calibration codes corresponding to each of the plurality of clock signals (apart from the reference clock signal). The generated skew calibration codes correspond to the first EOM PI code.

For a particular clock signal, the embodiments include obtaining skew calibration codes corresponding to all EOM PI codes. The embodiments include computing an average of the skew calibration codes for obtaining an average skew calibration code. The average skew calibration code is determined for countering non-linearity in the receiver 500. Similarly, for all clock signals average skew calibration codes are determined.

At step 1307, the method includes performing a positive phase shift or a negative phase shift to each of the plurality of clock signals, based on the corresponding skew calibration codes, for calibrating the detected skews. For a particular clock signal, the embodiments include locking the edges of the clock signal with the edges of the reference clock signal by introducing the positive phase shift or negative phase shift, based on the skew calibration code corresponding to the clock signal. Similarly, appropriate phase shifts are performed in each of the plurality of clock signals based on the corresponding skew calibration codes, for locking the edges of each of the plurality of the clock signals with the edges of the reference clock signal. This allows calibrating the detected skews in the plurality of clock signals with respect to the reference clock signal.

The various operations in the flowchart 1300 may be performed in the order presented, in a different order, or simultaneously. Further, in some embodiments, some operations listed in FIG. 13 may be omitted.

The embodiments disclosed herein can be implemented through at least one software program running on at least one hardware device and performing network management functions to control the network elements. The network elements shown in FIG. 5 include blocks which can be at least one of a hardware device, or a combination of hardware device and software module.

The embodiments disclosed herein describe methods and systems for performing clock skew calibration in a receiver. It should be understood that the scope of the protection is extended to such a program and in addition to a computer readable means having a message therein, such computer readable storage means contain program code means for implementation of one or more steps of the method, when the program runs on a server or mobile device or any suitable programmable device. The method may be implemented through or together with a software program written in, for example, a Very high speed integrated circuit Hardware Description Language (VHDL), or any other programming language, or implemented by one or more VHDL or several software modules being executed on at least one hardware device. The hardware device can be any kind of portable device that can be programmed. The device may also include means, which could be, for example, a hardware means, for example, an Application-specific Integrated Circuit (ASIC), or a combination of hardware and software means, for example, an ASIC and a Field Programmable Gate Array (FPGA), or at least one microprocessor and at least one memory with software modules located therein. The method embodiments described herein may be implemented partly in hardware and partly in software. Alternatively or additionally, the embodiments may be implemented on different hardware devices, e.g., using a plurality of Central Processing Units (CPUs).

The foregoing description of the specific embodiments describe the general nature of the embodiments herein. However, a person skilled in the art may readily modify, improve, and/or substitute certain elements of the one or more embodiments without departing from the inventive concept, and, therefore, such modifications, improvements and substitutions shall be understood as falling within the scope of the disclosure. It is to be understood that the phraseology or terminology used herein is for the purpose of description and should not be construed as limiting the scope of the disclosure. Therefore, while the specific embodiments have been shown and described, those skilled in the art will recognize that the embodiments can be practiced with modification within the scope of the disclosure.

What is claimed is:

1. A method for performing calibration on a clock skew in a receiver, the method comprising:
   repeatedly sampling, by the receiver, a skew in an edge of a clock with respect to an edge of a reference clock, to obtain a plurality of first values sampled by the clock and a plurality of second values sampled by the reference clock at edges of a data pattern;
   determining, by the receiver, a count associated with the skew from a de-serialized data word, wherein the de-serialized data word comprises a plurality of outcome values obtained based on the plurality of first values sampled by the clock and the plurality of second values sampled by the reference clock, at a predefined number of the edges of the data pattern;
   obtaining, by the receiver, a skew calibration code corresponding to a first Phase Interpolator (PI) code, from a binary variable, wherein the binary variable is obtained by accumulating an encoded variable generated based on the count associated with the skew in the de-serialized data word to a previously generated binary variable; and
   calibrating, by the receiver, the skew in the edge of the clock by performing one of a positive phase shift or a negative phase shift to the clock based on the skew calibration code, to align edges of the clock with the edges of the data pattern and edges of the reference clock,
   wherein the clock is an edge sampling clock, and the edge sampling clock samples at edges of the data pattern.

2. The method as claimed in claim 1, wherein the receiver comprises a data sampler, and positive edges of the edge sampling clock are used by the data sampler to sample the edges of data pulses in the data pattern.

3. The method as claimed in claim 1, wherein the reference clock is an edge sampling clock, and wherein the reference clock samples the edges of the data pattern.

4. The method as claimed in claim 1, wherein the skew is one of a positive skew and a negative skew, and
   wherein each of the plurality of outcome values in the de-serialized data word indicates at least one from among the positive skew, the negative skew, and an absence of skew.

5. The method as claimed in claim 4, wherein the encoded variable is determined as a positive binary one based on a count of the positive skew indicated in the de-serialized data word being greater than a count of the negative skew indicated in the de-serialized data word.

6. The method, as claimed in claim 4, wherein the encoded variable is determined as a negative binary one based on a count of the positive skew indicated in the de-serialized data word being less than a count of the negative skew indicated in the de-serialized data word.

7. The method, as claimed in claim 4, wherein the encoded variable is determined as zero based on a count of the positive skew indicated in the de-serialized data word being equal to a count of the negative skew indicated in the de-serialized data word.

8. The method as claimed in claim 1, wherein the skew calibration code is obtained by extracting a predefined number of bits from the binary variable, and
   wherein the binary variable and the previously generated binary variable are 16-bit binary numbers, and the previously generated binary variable is obtained by accumulating encoded variables generated from previous de-serialized words.

9. The method as claimed in claim 8, wherein the positive phase shift and the negative phase shift are performed on the clock based on the predefined number of bits of the skew calibration code.

10. The method as claimed in claim 8, wherein the positive phase shift is performed on the clock based on the skew calibration code being less than a previously generated skew calibration code, and
    wherein the negative phase shift is performed on the clock based on the skew calibration code being more than the previously generated skew calibration code.

11. The method as claimed in claim 8, wherein 6-bits from most significant bits (MSB) of the binary variable is extracted from the binary variable to create the skew calibration code.

12. The method as claimed in claim 1, wherein the method further comprises:
    changing, by the receiver, from a first eye opening margin (EOM) PI code to a second EOM PI code; and
    obtaining, by the receiver, a predefined number of skew calibration codes corresponding to a predefined number of PI codes, wherein the predefined number of PI codes are based on the second EOM PI code.

13. The method as claimed in claim 12, wherein the method further comprises obtaining, by the receiver, an average skew calibration code by computing an average of the predefined number of skew calibration codes.

14. The method as claimed in claim 1, wherein the calibrating comprises aligning the edges of the reference clock to edges of a complementary data pattern.

15. An apparatus for performing calibration on a clock skew, comprising:
    at least one processor configured to:
    repeatedly sample a skew in an edge of a clock with respect to an edge of a reference clock, to obtain a plurality of first values sampled by the clock and a plurality of second values sampled by the reference clock at edges of a data pattern;

determine a count associated with the skew from a de-serialized data word, wherein the de-serialized data word comprises a plurality of outcome values obtained based on the plurality of first values sampled by the clock and the plurality of second values sampled by the reference clock, at a predefined number of the edges of the data pattern;

obtain a skew calibration code corresponding to a first Phase Interpolator (PI) code, from a binary variable, wherein the binary variable is obtained by accumulating an encoded variable generated based on the count associated with the skew in the de-serialized data word to a previously generated binary variable; and calibrate the skew in the edge of the clock by performing one of a positive phase shift or a negative phase shift to the clock based on the skew calibration code, to align edges of the clock with the edges of the data pattern and edges of the reference clock.

16. The apparatus as claimed in claim 15, wherein the skew in the edge of the clock is one of a positive skew and a negative skew, and wherein each of the plurality of outcome values in the de-serialized data word indicates at least one from among the positive skew, the negative skew, and an absence of skew.

17. The apparatus as claimed in claim 16, wherein the at least one processor is further configured to:

obtain the skew calibration code by extracting a predefined number of bits from the binary variable, wherein the binary variable and the previously generated binary variable are 16-bit binary numbers, and the previously generated binary variable is obtained by accumulating encoded variables generated from previous de-serialized words.

18. The apparatus as claimed in claim 17, wherein the at least one processor is further configured to perform the positive phase shift and the negative phase shift on the clock based on the predefined number of bits of the skew calibration code.

19. The apparatus as claimed in claim 17, wherein the at least one processor is further configured to:

perform the positive phase shift on the clock based on the skew calibration code being less than a previously generated skew calibration code, and perform the negative phase shift on the clock based on the skew calibration code being more than the previously generated skew calibration code.

20. A non-transitory computer-readable storage medium storing a computer program, when executed by at least one processor, the at least one processor is configured to:

repeatedly sample a skew in an edge of a clock with respect to an edge of a reference clock, to obtain a plurality of first values sampled by the clock and a plurality of second values sampled by the reference clock at edges of a data pattern;

determine a count associated the skew from a de-serialized data word, wherein the de-serialized data word comprises a plurality of outcome values obtained based on the plurality of first values sampled by the clock and the plurality of second values sampled by the reference clock, at a predefined number of the edges of the data pattern;

obtain a skew calibration code corresponding to a first Phase Interpolator (PI) code, from a binary variable, wherein the binary variable is obtained by accumulating an encoded variable generated based on the count associated with the skew in the de-serialized data word to a previously generated binary variable; and calibrate the skew in the edge of the clock by performing one of a positive phase shift or a negative phase shift to the clock based on the skew calibration code, to align edges of the clock with the edges of the data pattern and edges of the reference clock.

* * * * *